United States Patent [19]

Fuchs et al.

[11] Patent Number: 4,534,008
[45] Date of Patent: Aug. 6, 1985

[54] PROGRAMMABLE LOGIC ARRAY

[75] Inventors: Peter Fuchs, Munich; Klaus Mueller-Glaser, Neuried; Dieter Schuett, Munich; Wolfgang Wach, Oberschleissheim, all of Fed. Rep. of Germany

[73] Assignee: Siemens Aktiengesellschaft, Berlin & Munich, Fed. Rep. of Germany

[21] Appl. No.: 486,311

[22] Filed: Apr. 19, 1983

[30] Foreign Application Priority Data

Apr. 27, 1982 [DE] Fed. Rep. of Germany ....... 3215671

[51] Int. Cl.³ ............................................. H03K 19/08
[52] U.S. Cl. .................................... 364/716; 307/465; 340/825.83
[58] Field of Search ......................... 364/716; 307/465; 340/825.83, 825.85, 825.87

[56] References Cited

U.S. PATENT DOCUMENTS

| | | | |
|---|---|---|---|
| 3,974,366 | 8/1976 | Hebenstreit | 364/716 |
| 4,032,894 | 6/1977 | Williams | 340/825.83 |
| 4,041,459 | 8/1977 | Horninger | 340/825.83 |
| 4,467,439 | 8/1984 | Rhodes | 364/716 |
| 4,488,230 | 12/1984 | Harrison | 364/716 |
| 4,488,246 | 12/1984 | Brice | 364/716 |

OTHER PUBLICATIONS

Kazmi, "Design Prototypes Quickly With Programmable Arrays," Electronic Design, Feb. 19, 1981, pp. 121-124.
"FPLA-A Freely Programmable Logic Array", Valvo Brief, Oct. 25, 1976.

Primary Examiner—David H. Malzahn
Attorney, Agent, or Firm—Hill, Van Santen, Steadman & Simpson

[57] ABSTRACT

Given a programmable logic array, all product terms of the product matrix are applied to a prescribable potential by way of a first control signal so that the following sum matrix is no longer influenced by the input variables. Additional transfer elements are controllable by a second control signal, the additional transfer elements being assigned to additional terminal connecting points between the sum terms of the sum matrix. Depending upon the execution and employment of the logic array, the two control signals can be independent of one another, identical to one another, or inverted relative to one another.

7 Claims, 2 Drawing Figures

PROGRAMMABLE LOGIC ARRAY

BACKGROUND OF THE INVENTION

1. Field of the Invention

The present invention relates to an integrated, programmable logic array having a product matrix, wherein control lines for true and inverted input variables are linked according to a programming rule with product lines for the formation of product signals, the linkage being with the assistance of semiconductor logic elements controlled by the input variables in such a manner that specific input variables generate the higher or the lower of two binary signal levels on product lines or do not influence the product lines at all, and having a sum matrix wherein the product lines are linked according to a further programming rule with sum lines for the formation of sum signals, the linkage being with the assistance of semiconductor logic elements controlled by the product lines in such a manner that specific product signals generate the higher or lower binary signal level on sum lines or do not influence sum lines at all.

2. Description of the Prior Art

Logic arrangements of the type set forth above are also known by the abbreviation PLA or the abbreviation FPLA, and are generally known in the art, for example, from the publications "Der Elektroniker", No. 3, 1981, pp. 44-48; "Valvo-Brief", Oct. 25, 1976, pp. 1-3; and "Electronic Design", Vol. 29, No. 4, 1981, pp. 121-124, all of which are fully incorporated herein by this reference. In such logic arrays, input stages connect the original input variables through on control lines of a product matrix in their true form and inverted form. Semiconductor elements are disposed at some of the intersections of the control lines with the product lines of the matrix, signal potentials on the product lines being controllable with the assistance of the semiconductor elements by way of the input variables. Corresponding logic elements are absent at other intersections or are suppressed. The product lines form the input lines for a sum matrix in which they intersect with sum lines. Here, also, the logic elements are generally effective only for a portion of the intersections. The signals existing on the same lines are amplified in output drivers and are sometimes inverted.

The logic functions of the product matrix and of the sum matrix must be matched to one another. Instead of an AND operation with a following OR operation, for example, a NOR operation can be formed twice (cf. Electronic Design supra.

In the manufacture of integrated, programmable logic arrays, logic or, respectively, switching elements are frequently first disposed at all intersections of the matrices, these then being partially suppressed in accordance with the programming rule by subsequent interruption of suitable connections, for example, by fusing fusable links.

Depending on the size of the two matrices of a programmable logic array, a more or less great multitude of complex logical functions can be realized, their type being determined by the programming.

Particularly in sequential circuits wherein the sum lines are, for example, connected to the data inputs of D flip-flops, it is frequently desirable to load an external datum into the flip-flops independently of the variables applied to the inputs of the logic array. Such a possibility also offers advantages in testing the sequential circuits.

Such expansions were heretofore possible only with a high additional surface expense for the matrices or by way of additional, external logic elements.

SUMMARY OF THE INVENTION

The object of the present invention is to provide a functional expansion of programmable logic arrays which requires little added expense and which fits into the regular structures required for integration.

The above object is achieved, according to the present invention, in a programmable logic array of the type set forth above having the state of product matrix and the state of sum matrix in that a control line charged with a first control signal is provided and is linkable to at least one portion of the product lines with the assistance of semiconductor logic elements controlled by the control signal, and in the transfer elements are controlled over a control line charged with a second control signal, the transfer elements connecting the sum lines to further signal terminals in their conductive condition.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
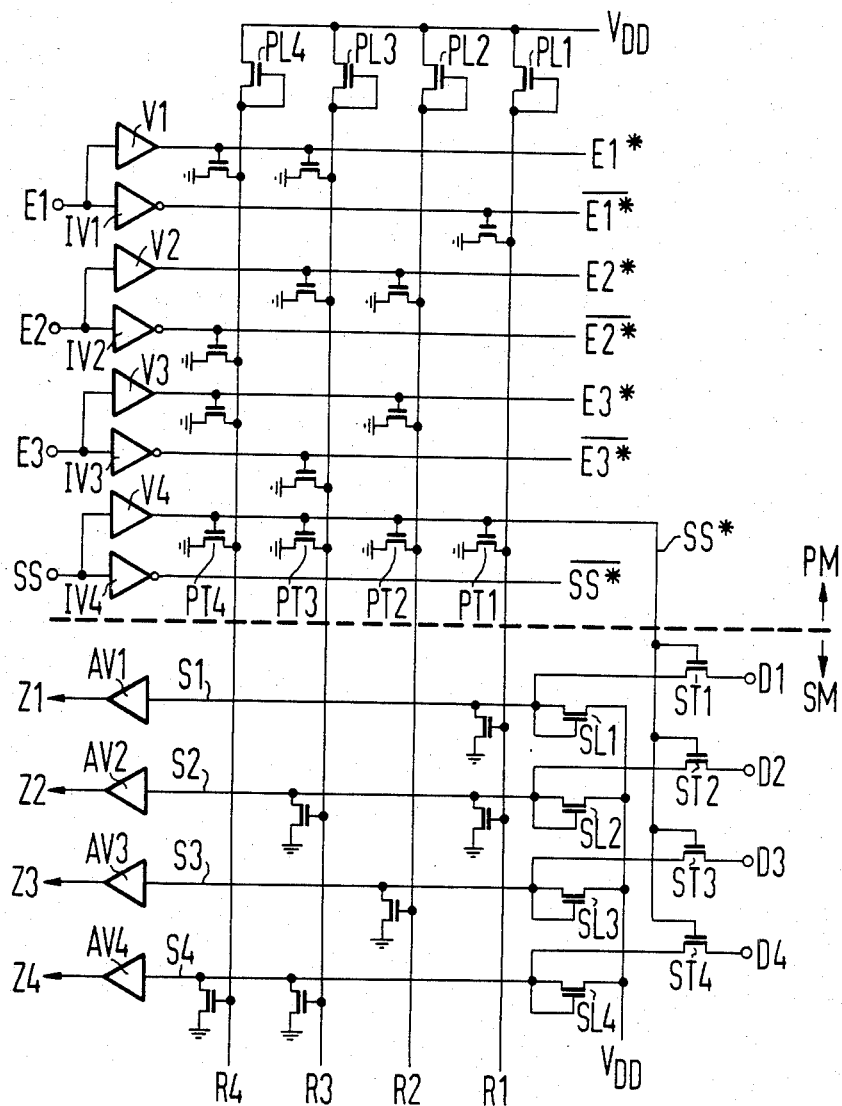
FIG. 1 is a schematic illustration of a programmable logic array constructed according to the present invention with metal-oxide-semiconductor (MOS) transistors and FIG. 2 is a schematic circuit diagram of a programmable logic array constructed with bipolar transistors.

FIG. 1 illustrates a circuit of a programmable logic array in NMOS technology having arbitrarily prescribed programming. The product matrix PM is designed for three input variables E1, E2 and E3. Each of the identically-referenced inputs leads into a noninverting amplifier V1-V3 and an inverting amplifier IV1-IV3 at whose outputs are connected control lines E1*, E1*-E3*, E3* for driving transistors and extending horizontally in the drawing are distributed in accordance with the programming rule to the points of intersection with four vertical product lines R1-R4. In accordance with their spatial distribution in their conductive condition, the transistors apply product lines to the zero potential. Product lines which are not connected to conductive transistors at least approximately assume the supply potential $V_{DD}$ which is supplied over load transistors PL1-PL4 of the depletion type.

The product lines R1-R4 form the input lines for the sum matrix SM which is constructed similar to the product matrix PM. In the sum matrix SM, a plurality of sum lines S1-S4 provide the outputs in place of the product lines R1-R4 which so functioned in the product matrix, the sum lines being connected over third further load transistors SL1-SL4 to the supply potential $V_{DD}$. At the output, the sum lines are connected to respective amplifiers AV1-AV4. After amplification, the operation results are available at the output terminals Z1-Z4 as output signals.

The portion of the logic array according to FIG. 1 described thus far corresponds to known embodiments. According to the invention, an input SS for a control signal is additionally provided, this extending over a non-inverting amplifier V4 and an inverting amplifier IV4. Two further control lines SS* and SS* of the product matrix are connected to the outputs of the two amplifiers V4 and IV4. As can be seen from FIG. 1, the inverting amplifier IV4 and the appertaining control line SS* could be omitted in the exemplary embodiment. A plurality of transistors PT1-PT4 which apply the product lines R1-R4 to the zero potential given a high binary signal level of the control SS* are provided at the intersections of the control line carrying the non-inverted control signal SS* with all product lines R1-R4. Therefore, all logic transistors of the sum matrix SM remain inhibited independently of the binary values of the input variables E1-E3.

The latter control line SS* in the product matrix is also connected to the control electrodes of further transistors ST1-ST4 whose control channels are connected between the sum lines S1-S4 of the sum matrix and additional terminal connecting points D1-D4. The transistors ST1-ST4 are referred to below as transfer elements. Given a high binary level of the control signal SS*, the data signals applied at the terminal points D1-D4 thus penetrate directly to the sum lines S1-S4 of the sum matrix and, therefore, to the outputs Z1-Z4 of the logic array.

Of the transistors PT1-PT4 in the product matrix PM, the individual transistors can also be eliminated or, respectively, disconnectible connections can be opened so that the potentials of the corresponding product lines are not influenced by the control signal SS or, respectively, SS*. What sum lines S1-S4 are connected to the involved product line or the involved product lines is thereby to be taken into consideration. The transfer elements assigned to such sum lines for the direct feed of data signals must then be eliminated or the appertaining inputs cannot be connected.

If, for example, the transistors PT1 in the product matrix were eliminated in the exemplary embodiment illustrated in FIG. 1, then the transfer functions ST1 and ST2 would also be superfluous (PT1→ST1, ST2; correspondingly applying PT2→ST3, PT3→ST2, ST4 and PT4→ST4).

Since the function of the transfer elements formed by the MOS transistors ST1-ST4 depends on the current direction, the terminal points D1-D4 can also serve as signal outputs for monitoring the events on the sum lines. This is very advantageous when the outputs Z1-Z4, as points within an integrated arrangement, are not accessible or are accessible only with difficulty, or when they are not to be constantly loaded by additional connecting lines.

It is necessary for this purpose to divide the heretofore only control line for the transistors PT1-PT4 and ST1-ST4 (cf. FIG. 1) into a first control line SS1* for the transistors PT1-PT4 of the product matrix PM and a second control line SS2* for the transistors or, respectively, transfer elements ST1-ST4 of the sum matrix SM and to provide independent control signals SS1 and SS2 for both control lines. SS1*=L, SS2*=H must then apply for the signals on the control lines for testing the normal logic operations of the logic array over the terminal points D1-D4, whereby L stands for the low binary signal level of the control signals and H stands for the high binary signal level of the control signals. SS1=L, SS2=H likewise occurs for the control signals applied at the corresponding control inputs when the amplifiers disposed between the control inputs and the control lines do not invert.

Figure 2:
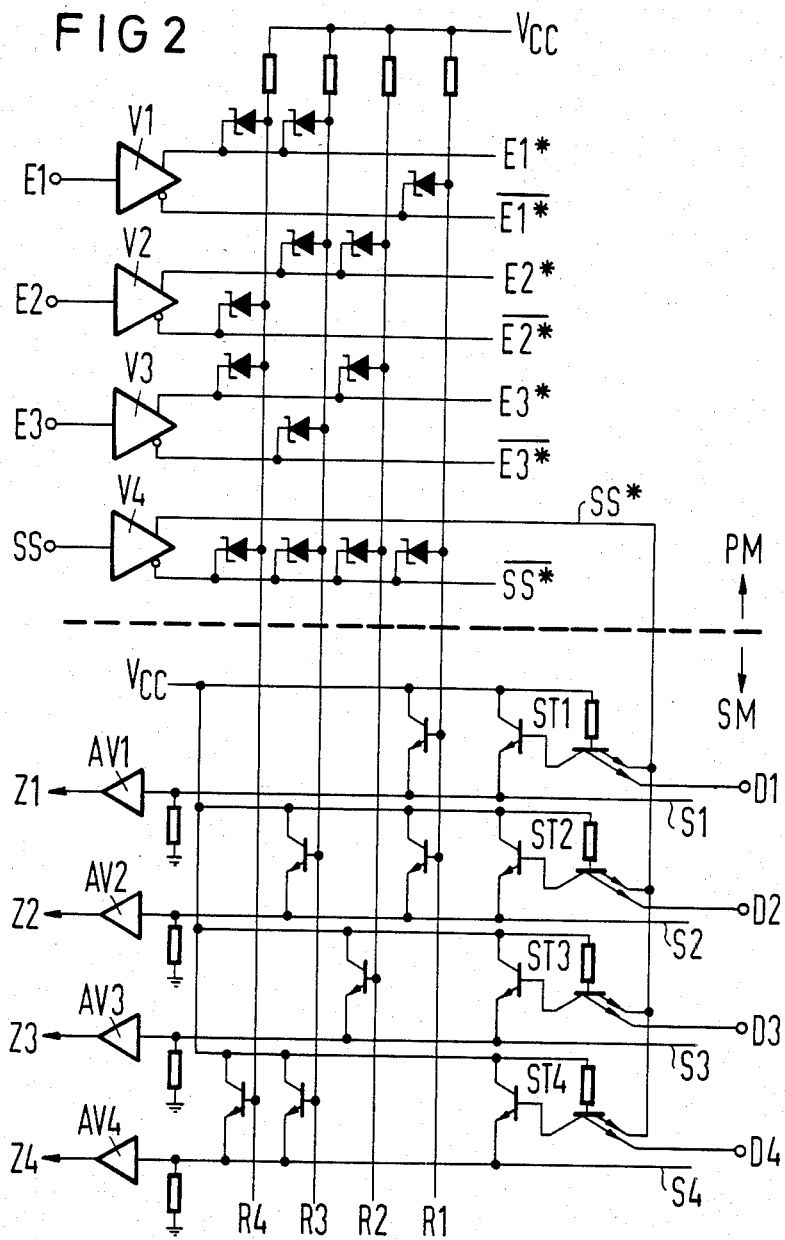

The expansion of the programmable logic array according to the present invention can also be undertaken when the logic array is designed in bipolar technique. FIG. 2 illustrates a simplified exemplary embodiment in this regard. The programming of the logic array, i.e. the distribution of the logic elements in the two matrices is again arbitrarily selected. Schottky diodes are provided as the logic elements in the product matrix and transistors in emitter follower configuration are provided in the sum matrix. This, however, is not a necessary condition.

Schottky diodes can likewise serve to inhibit the product matrix, these being connected, on the one hand, to the product lines and, on the other hand, to the inverting output of the amplifier V4 for the control signal SS.

The transfer elements ST1-ST4 are designed as AND elements in the manner of transistor-transistor logic (TTL) circuits, with the difference that the respectively second transistors in the direction of the signal flow are connected as emitter followers. The respective first transistors exhibit two emitters of which ones are connected in common to the noninverting output of the amplifier V4 and the others are connected to the terminal points D1-D4, respectively. It is clear that the terminal points D1-D4 can only serve as data inputs in this case.

A multitude of new functions can be realized by the series connection of two or more expanded logic arrays, of which only two are mentioned here, given limitation to the series connection of two logic arrays.

By connecting the outputs $Z_{i1}$ of the first logic array PLA1 to the data inputs $D_{i2}$ of the second logic array PLA2 without transposition, one obtains, depending on the control signal SS of the second logic array, the imminent logic result corresponding to the respective programming at the outputs $Z_{i2}$ either of the first or of the second logic array. Thereby, the variables applied to the variable inputs $E_{k1}$ and $E_{k2}$ can be identical, partially different or entirely different.

A further possibility resides in connecting the outputs $Z_{i1}$ of a first logic array to both the variable inputs $E_{k2}$ and the data inputs $D_{i2}$ of the second logic array in arbitrary transposition. An encoding of the original logic functions selectable with the assistance of the control signal SS of the second logic arrangement derives therefrom.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a programmable logic array of the type in which a product matrix includes product lines and control lines connected to input terminals, in which true and inverted control signals on the control lines link the control lines to the product lines in accordance with a predetermined first programming rule defined by a plurality of first semiconductor components connected at selected crosspoints of the product and control lines, in which the plurality of first semiconductor components selectively places a high or low binary signal on or does not influence the product lines in response to the control signals, and in which a sum matrix includes sum lines forming crosspoints with the product lines and a plurality of second semiconductor components at selected crosspoints in accordance with a predetermined second programming rule, and in which the second plurality of semiconductor components are controlled by the product signals on the product lines to selectively place high or low binary signals on or to not at all influence the sum lines, the improvement therein comprising:

first and second additional control lines for carrying respective additional first and second control signals;

a plurality of third semiconductor components connected between said first additional control line and at least some of the product lines and operated by said first additional control signals for linkage with these product lines; and a plurality of transfer elements connected to said second additional control line and connected between further input terminals and the sum lines and operable in response to the second additional control signals to connect the sum lines and the additional input terminals.

2. The improved programmable logic array of claim 1, wherein:
said first and second semiconductor components and said transfer elements comprise metal-oxide-semiconductor transistors.

3. The improved programmable logic array of claim 1, wherein:
said first and second additional control signals are independent signals.

4. The improved programmable logic array of claim 1, wherein:
said second additional control line is an extension of said first additional control line and said first and second additional control signals are identical signals.

5. The improved programmable logic array of claim 1, wherein:
said first and second semiconductor components and said transfer elements comprise bipolar transistors.

6. The improved programmable logic array of claim 1, wherein:
said first semiconductor components comprise diodes; and
said second semiconductor components and said transfer elements comprise bipolar transistors.

7. The improved programmable logic array of claim 1, and further comprising:
means for providing said first and second additional signals inverted with respect to one another.

* * * * *